US010742736B2

(12) United States Patent
Xu et al.

(10) Patent No.: US 10,742,736 B2
(45) Date of Patent: Aug. 11, 2020

(54) INTEGRATED ERASURE CODING FOR DATA STORAGE AND TRANSMISSION

(71) Applicant: Western Digital Technologies, Inc., San Jose, CA (US)

(72) Inventors: Jun Xu, Singapore (SG); Robert P. Ryan, Mission Viejo, CA (US); Grant C. Mackey, Irvine, CA (US); James N. Malina, Irvine, CA (US); Robin O'Neill, Trabuco Canyon, CA (US); Nils E. Larson, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 311 days.

(21) Appl. No.: 15/847,761

(22) Filed: Dec. 19, 2017

(65) Prior Publication Data

US 2019/0190979 A1    Jun. 20, 2019

(51) Int. Cl.
*H04L 29/08* (2006.01)
*H03M 13/37* (2006.01)
*H04N 21/231* (2011.01)

(52) U.S. Cl.
CPC ...... *H04L 67/1097* (2013.01); *H03M 13/373* (2013.01); *H04L 67/2842* (2013.01);
(Continued)

(58) Field of Classification Search
CPC .. H03M 13/03; H03M 13/13; H03M 13/1515; H03M 13/154; H03M 13/373;
(Continued)

(56) References Cited

U.S. PATENT DOCUMENTS 8,169,916 B1   5/2012  Pai et al.
8,504,535 B1 *  8/2013  He ...................... G06F 16/9574
                                                       707/695

(Continued)

OTHER PUBLICATIONS

T. Tran, T. Nguyen, B. Bose and V. Gopal, "A hybrid network coding technique for single-hop wireless networks," in IEEE Journal on Selected Areas in Communications, vol. 27, No. 5, pp. 685-698, Jun. 2009. (Year: 2009).*

(Continued)

*Primary Examiner* — Michael Won
*Assistant Examiner* — William C McBeth
(74) *Attorney, Agent, or Firm* — Barry IP Law, P.C.

(57) ABSTRACT

Embodiments of network devices for content distribution are described. In some embodiments, an edge network device integrates network coding for content distribution with erasure coding for data storage. Embodiments of methods of integrating network coding and erasure coding are also disclosed. In some embodiments, an edge network device can determine content distribution and storage for content based on one or more penalty functions that assess storage capacity, computational power, user demand, and/or network bandwidth for optimal resource usage. In some embodiments, an edge network device creates fragments of content and transmits a subset of the fragments for early distribution. In response to a user request for the content, the edge network device can transmit the remaining fragments to the user device for the user device to reconstruct the original content.

19 Claims, 9 Drawing Sheets

(52) U.S. Cl.
CPC ..... *H04N 21/231* (2013.01); *H04N 21/23106* (2013.01); *H04L 67/06* (2013.01)

(58) Field of Classification Search
CPC ......... H04L 29/08549; H04L 29/08729; H04L 65/4069; H04L 65/4084; H04L 65/60; H04L 65/601; H04L 65/605; H04L 65/607; H04L 65/80; H04L 67/06; H04L 67/10; H04L 67/1074; H04L 67/1076; H04L 67/1078; H04L 67/108; H04L 67/1095; H04L 67/1097; H04L 67/28; H04L 67/2823; H04L 67/2842; H04L 67/2847; H04L 67/289; H04L 67/327; H04N 21/222; H04N 21/231; H04N 21/23106

See application file for complete search history.

(56) References Cited

U.S. PATENT DOCUMENTS

| | | | | |
|---|---|---|---|---|
| 8,561,116 | B2* | 10/2013 | Hasek | H04L 67/2823 725/92 |
| 9,942,084 | B1* | 4/2018 | Sorenson, III | H04L 29/08549 |
| 2005/0249240 | A1 | 11/2005 | Boyce et al. | |
| 2010/0095184 | A1 | 4/2010 | Zuckerman et al. | |
| 2011/0107078 | A1* | 5/2011 | Resch | G06F 11/1092 713/150 |
| 2011/0212717 | A1 | 9/2011 | Rhoads et al. | |
| 2012/0159558 | A1 | 6/2012 | Whyte et al. | |
| 2013/0179490 | A1* | 7/2013 | Naga | H04L 67/1097 709/203 |
| 2014/0025837 | A1* | 1/2014 | Swenson | H04N 21/222 709/231 |
| 2014/0067898 | A1* | 3/2014 | Steiner | H04N 21/222 709/201 |
| 2014/0282750 | A1* | 9/2014 | Civiletto | H04N 21/23106 725/74 |
| 2014/0351674 | A1* | 11/2014 | Grube | G06F 11/1076 714/764 |
| 2016/0065976 | A1 | 3/2016 | He et al. | |
| 2017/0149860 | A1 | 5/2017 | Eli et al. | |
| 2018/0146060 | A1* | 5/2018 | Foerster | H04L 43/16 |

OTHER PUBLICATIONS

A. Ravi, P. Ramanathan and K. M. Sivalingam, "Integrated network coding and caching in information-centric networks," 2014 IEEE International Conference on Advanced Networks and Telecommuncations Systems (ANTS), New Delhi, 2014, pp. 1-6. (Year: 2014).*

V. Bioglio, F. Gabry and I. Land, "Optimizing MDS Codes for Caching at the Edge," 2015 IEEE Global Communications Conference (GLOBECOM), San Diego, CA, 2015, pp. 1-6. (Year: 2015).*

K. Matsuzono, H. Asaeda and T. Turletti, "Low latency low loss streaming using in-network coding and caching," IEEE INFOCOM 2017—IEEE Conference on Computer Communications, Atlanta, GA, May 2017, pp. 1-9. (Year: 2017).*

Dimakis, et al., "A Survey on Network Codes for Distributed Storage", Proceedings of the IEEE, Mar. 2011, pp. 476-489, vol. 99, No. 3.

Huang, et al., "Bandwidth-Efficient Packet Scheduling for Live Streaming With Network Coding", IEEE Transactions on Multimedia, Apr. 2016, pp. 752-763, vol. 18, No. 4.

Magli, et al., "Network Coding Meets Multimedia: a Review", arXiv:1211.4206v1 [cs.MM], Nov. 18, 2012, 19 pages.

Ostovari, et al., "Scalable Video Streaming With Helper Nodes Using Random Linear Network Coding", IEEE/ACM Transactions on Networking, Jun. 2016, pp. 1574-1587 vol. 24, No. 3.

Sipos, et al., "Distributed Cloud Storage Using Network Coding", IEEE Consumer Communications and Network Conference, 2014, 7 pages.

Szabo, et al., "Network Coding as a Service", arXiv:1601.03201v1 [cs.NI] Jan. 13, 2016, 11 pages.

U.S. Appl. No. 15/635,039, filed Jun. 27, 2017, entitled "Hybrid Data Storage System With Private Storage Cloud and Public Storage Cloud".

U.S. Appl. No. 15/635,056, filed Jun. 27, 2017, entitled "Hybrid Data Storage System With Private Storage Cloud and Public Storage Cloud".

U.S. Appl. No. 15/282,837, filed Sep. 30, 2016, entitled "Data Storage System With Multimedia Assets".

Pending U.S. Appl. No. 15/847,734, filed Dec. 19, 2017, entitled "Hybrid Techniques for Content Distribution With Edge Devices", Jun Xu et al.

Written Opinion of the International Searching Authority dated Jan. 18, 2019 for International Application No. PCT/US2018/052718, 7 pages.

* cited by examiner

INTEGRATED ERASURE CODING FOR DATA STORAGE AND TRANSMISSION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

The present disclosure relates to data or content distribution systems, and more particularly, to content distribution systems to improve network bandwidth usage and/or quality of experience for the end user.

Description of the Related Art

Technological advances in video streaming services have allowed for more video content to reach end users and to provide higher quality video streaming services with faster response times. However, increased demand for such services have led to increase use of network bandwidth. As video technology, video servicing, network, and telecommunications technology continues to improve, more users may stream video and each user may stream more content. Furthermore, video quality may continue to improve, resulting in an increase in file size. Service providers have attempted to maintain a certain level of quality of experience for the user while at the same time reduce the network load during peak times by transmitting content ahead of time and allowing a user to view the content later. However, such approaches require early distribution and storage of sensitive content (such as, copyrighted episodes that have not yet been shown to the public). Service providers have used encryption techniques to provide protection and security for the early distributed sensitive content. But such an approach increases computational demand and design complexity on both the video streaming service provider and on the user device. As such, new methods and systems for distributing content to the user are needed that allows for scalability, optimized use of network bandwidth, and protection for sensitive content using current telecommunications infrastructure.

BRIEF DESCRIPTION OF THE DRAWINGS

The innovations described in the claims each have several aspects, no single one of which is solely responsible for its desirable attributes. Without limiting the scope of the claims, some prominent features of this disclosure will now be briefly described.

DETAILED DESCRIPTION

Figure 1:
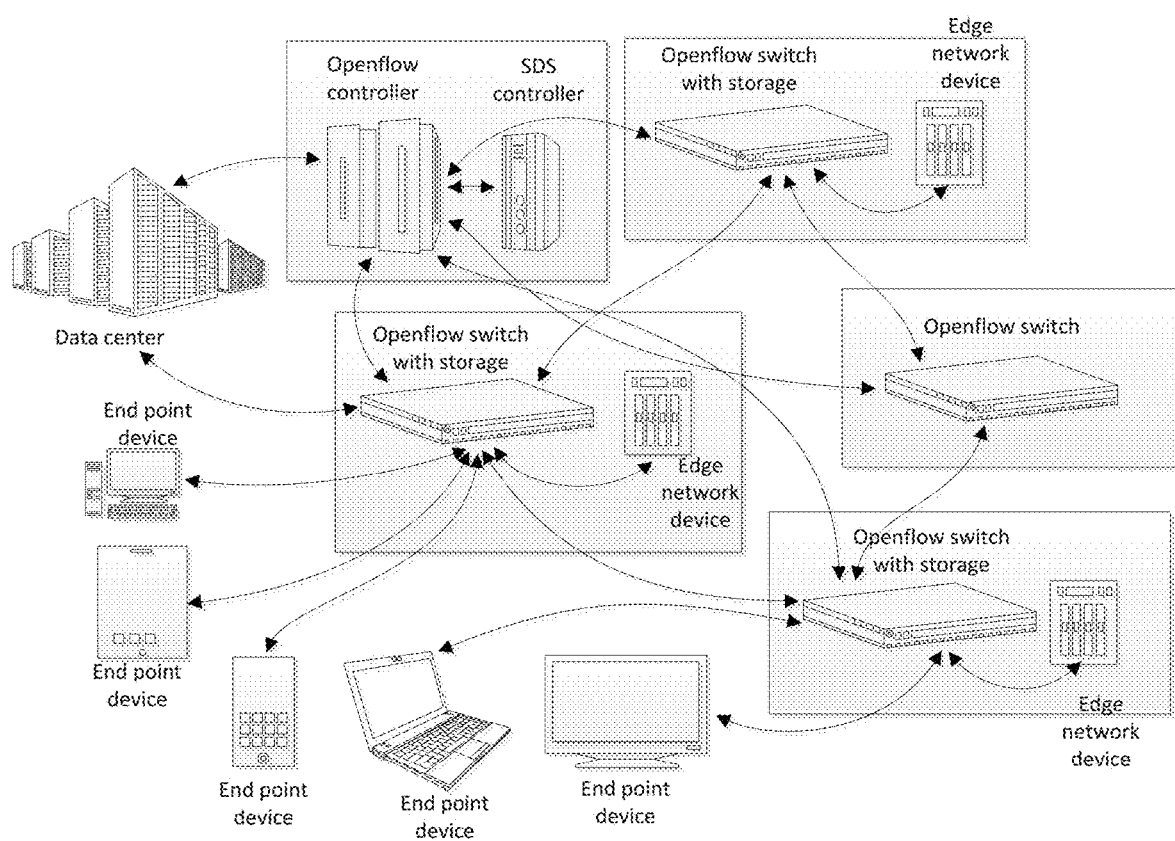
FIG. 1 is a block diagram illustrating a physical network infrastructure with a global controller according to some embodiments of the present disclosure.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Generally, some embodiments of systems and methods described herein improve content distribution (such as, video streaming content) by reducing computational demand, optimizing network usage, and/or providing protection for content. Some embodiments of the present disclosure describe the integration of network coding for content distribution with erasure coding for data storage. The integrated erasure coding scheme for an edge network device can be used to determine content distribution and storage for content based on one or more penalty functions. The one or more penalty functions can be based on certain characteristics of the content, network, demand, telecommunications infrastructure, user device, and the like. For example, the one or more penalty functions can assess the penalty for storage capacity, computational power, user demand at certain time periods, protection level desired for sensitive content, and/or network bandwidth for optimal resource usage.

Great progress has been made in video technology and data transfer technology. As a result, Internet users are transferring data to and from their personal computing devices at an ever-increasing rate. With the rise of global Internet traffic, the demand for bandwidth is leading to bandwidth bottlenecks and network peak times, where users experience lower quality in response to user requests for content, for example, for video streaming services.

Telecommunication companies and internet service providers often struggle with demand for streaming content due to the lack of available bandwidth caused either by bandwidth usage at certain time periods or limitations with existing infrastructure. To relieve such bandwidth requirements, copies of content can be stored at edge network devices located closer to end points instead of retrieving content directly from data centers. However, due to copyright laws for video content and the protections afforded to the content owners, telecommunication companies would have to obtain rights for each copy placed at an edge network device, which can become very costly. To effectively offload the data center, many edge network devices may have to be created, and each edge network device may have to store a copy of content likely requested by the user. Thus, telecommunication companies may not be financially incentivized to store multiple copies of content at the edge network devices. Furthermore, telecommunication companies may not want to send sensitive content directly to the user device for early distribution for protection and security of copyrighted content.

In some embodiments of the present disclosure, an edge network device can implement erasure coding to create fragments of content, where the fragments of content can be used at a later time to reconstruct the streaming content. The edge network device can determine whether to use an integrated network coding scheme to transmit a subset of the fragments of content that the user will likely request for early distribution based on one or more penalty functions. For example, when the user requests the content at the later time, an edge network device assess whether the penalty of transmitting the remainder of the fragments for the end point to reconstruct the full streaming content is better than the penalty of transmitting the content itself. The edge network device can transmit the remainder of the fragments of content to the end point (such as, a user computing device), and the end point can reconstruct the full streaming content by using the preemptively received fragments and the received remainder fragments.

In some embodiments, the edge network device can assess whether the penalty of receiving the remainder of the fragments for the edge network device to reconstruct the full streaming content is better than receiving the full content itself from a data center. The edge network device can receive the remainder of the fragments of content from the data center, and the edge network device can use all fragments of the content to reconstruct the full streaming content.

Accordingly, computational workload is pushed onto the edge network device and/or the end point (such as, a user computing device). The early distribution of the subset of the fragments of content can be distributed when network bandwidth is available. Because only a subset of the fragments of the content is transmitted for early distribution, the end points and/or the edge network devices cannot reconstruct the full streaming content until the end points and/or the edge network devices receive the remainder of the fragments of the content, and as such, the content is protected from copyright violations. Furthermore, because only the remainder of the fragments of the content is transmitted at the time of the user request, the network bandwidth usage in response to the user request is reduced.

Network coding ("NC") over a lossy channel can significantly reduce packet loss and improve user Quality of Experience ("QoE"), in particular for wireless networks (such as, the 3G/LTE networks). Erasure coding ("EC") enables data transmission over the network and data storage in a distributed system. As such, the integrated erasure coding scheme for an edge network device can reduce computational cost and data storage input and output ("I/O") access via an integrated erasure coding and network coding solution that applies a balanced resource usage process.

In some embodiments, an erasure coding scheme is applied both to the networked data side and the stored data side such that the networked data side and/or the stored data side may apply the coded data directly. A balanced process can be applied to determine whether the networked data side or the stored data side applies the coded data. The process can make this determination based on a penalty function, such as a penalty function for computational cost and data storage I/O access cost. For example, the process can reduce the computational cost when the networked data side and/or the stored data side requires higher level of protection and/or redundancy. In some embodiments, the network coding packets for the data and parity can be stored directly if the storage device includes data protection and/or a resource efficiency requirement, whereas the storage device may read the coded data directly for the network coding requirement when computational resource is limited.

Various embodiments of this disclosure provide a network device, can comprise: a memory comprising a cache and permanent storage; and one or more processors configured to receive a request for information from a user device, the one or more processors further configured to: in response to determining that an encoded version of the requested information is stored in the memory of the network device: in response to determining that a network condition does not satisfy a transmission quality threshold: in response to determining that the encoded version of the requested information is not stored in the cache of the network device: in response to determining that a penalty for encoding the requested information exceeds a penalty for retrieving the encoded version of the requested information from the permanent storage of the network device, retrieve and transmit the encoded version of the requested information to the user device by applying network coding; and in response to determining that the penalty for encoding the requested information does not exceed the penalty for retrieving the encoded requested information from the permanent storage of the network device, partially retrieve the requested information from the permanent storage, encode the partially retrieved requested information to produce an encoded version of the requested information, and transmit the produced encoded version of the requested information to the user device by applying network coding.

The network device of the preceding paragraph can include one or more of the features described in the following paragraphs as well as elsewhere in the specification. In some embodiments, the one or more processors are further configured to: in response to determining that the network condition satisfies a transmission quality threshold, transmit the encoded requested information to the user device without applying network coding.

In some embodiments, the one or more processors are further configured to: in response to determining that the encoded requested information is stored in the cache of the network device, transmit the encoded requested information to the user device.

In some embodiments, the one or more processors are further configured to: in response to determining that the received requested information can be stored in the memory of the network device: in response to determining that an amount of the received requested information satisfies an encoding threshold, encode the received requested information, store the encoded received requested information in the permanent storage of the network device, and transmit the encoded requested information based on the network condition.

In some embodiments, to transmit the requested information based on the network condition comprises transmitting the requested information via network coding using a butterfly network with at least one multicast session.

In some embodiments, to transmit the requested information based on the network condition comprises selecting a type of network coding based on the network condition, wherein the type of network coding includes at least one of: a deterministic network coding scheme or a random network coding scheme.

In some embodiments, the one or more processors are further configured to: in response to determining that the received requested information can be stored in the memory of the network device: in response to determining that an amount of the received requested information satisfies an encoding threshold, encode the received requested information, store the encoded received requested information in the permanent storage of the network device, and transmit the encoded requested information based on the network condition.

In some embodiments, wherein the one or more processors are further configured to: in response to determining that the amount of the received requested information does not satisfy the encoding threshold: in response to determining that the encoding threshold can be satisfied within a time duration, encode the received requested information, store the encoded received requested information in the permanent storage of the network device, and transmit the encoded requested information based on the network condition; and in response to determining that the encoding threshold cannot be satisfied within the time duration, request that the requested information be transmitted from the data center.

In some embodiments, a system comprises the network device.

Various embodiments of this disclosure provide a method of transmitting data comprising: in response to determining that requested information is not stored in a cache of a network device: in response to determining that a penalty for encoding the requested information exceeds the penalty for retrieving the requested information from a storage external to the network device, retrieving and transmitting the requested information by applying network coding; and in response to determining that a penalty for encoding the requested information does not exceed the penalty for retrieving the requested information from the storage external to the network device, partially retrieving the requested information from the storage external to the network device, encoding the partially retrieved requested information to produce an encoded version of requested information, and transmitting the produced encoded version of the requested information by applying network coding.

The method of the preceding paragraph can include one or more of the features described in the following paragraphs as well as elsewhere in the specification. In some embodiments, determining that the penalty for encoding the requested information exceeds the penalty for retrieving the encoded requested information from the storage external of the network device is based on at least one of: a processing consumption, a response time, a segment quality, a storage capability, a power consumption, or a buffering time.

In some embodiments, the penalty for encoding the requested information is based on processing consumption, and the penalty for retrieving the encoded requested information from the storage external of the network device is based on storage capability.

In some embodiments, the encoded version of the requested information is encoded using erasure coding. In some embodiments, the requested information comprises video content. In some embodiments, the network device comprises a switch.

In some embodiments, transmitting the produced encoded version of the requested information comprises transmitting the requested information based on network conditions by selecting a type of network coding based on the network conditions, wherein the type of network coding includes a hybrid network coding scheme.

Various embodiments of this disclosure provide a network device, comprising: a memory comprising a cache and permanent storage; and one or more processors configured to receive a request for information from a user device, the one or more processors further configured to: in response to determining that encoded requested information is stored in the memory of the network device: in response to determining that a penalty for encoding the requested information exceeds the penalty for retrieving the encoded requested information from the permanent storage of the network device, retrieve and transmit the encoded requested information to the user device by applying network coding; and in response to determining that a penalty for encoding the requested information does not exceed the penalty for retrieving the encoded requested information from the permanent storage of the network device: partially retrieve the requested information from the permanent storage, encode the partially retrieved requested information to produce an encoded version of the requested information, and transmit the encoded version of the requested information to the user device by applying network coding.

The network device of the preceding paragraph can include one or more of the features described in the following paragraphs as well as elsewhere in the specification. In some embodiments, the encoded version of the requested information is encoded using erasure coding. In some embodiments, the requested information comprises video content.

In some embodiments, the penalty for encoding the requested information is based on processing consumption, and the penalty for retrieving the encoded requested information from the permanent storage of the network device is based on storage capability.

In some embodiments, to transmit the requested information based on the network condition comprises transmitting the requested information via network coding using a butterfly network with at least one multicast session. In some embodiments, the network device comprises a switch. In some embodiments, a system comprises the network device.

System Overview

FIG. 1 is a block diagram illustrating a physical network infrastructure with one global controller according to some embodiments of the present disclosure. The physical network infrastructure can include edge network devices, OpenFlow switches, OpenFlow switches with storage, OpenFlow controllers, software defined storage controllers, data centers, and/or end point devices. In some embodiments, non-OpenFlow components can be used instead of or in combination with OpenFlow components. The physical network infrastructure can be used to implement the integrated network coding and erasure coding. The physical network infrastructure illustrates inter-network edge devices with both limited storage and computing functionality.

In some embodiments, the physical network infrastructure comprises edge network devices. The edge network devices can include a device that provides an entry point into enterprise or service provider core networks. Edge network devices can include routers, routing switches, integrated access devices, multiplexers, metropolitan area network and/or wide area network access devices, and the like. Edge devices can provide connections into carrier and/or service provider networks. Edge devices can include microservers with limited storage and bandwidth resources that route, download, and/or store videos to service user requests.

In some embodiments, the physical network infrastructure comprises Software Defined Networks ("SDN") controllers (such as, OpenFlow controller) and Software Defined Storage ("SDS") controllers. The software defined network and software defined storage controllers can distribute the proper network coding for data forwarding and/or routing policies to the software defined network switches (such as, OpenFlow switch, OpenFlow switch with storage). The OpenFlow/SDN and SDS controllers can distribute erasure coding policies to the SDS devices. In some embodiments, other non-OpenFlow components can be used instead of or in combination with OpenFlow components.

In some embodiments, the edge network device can receive and/or store a subset of the fragments of the content from erasure coding. The edge network device can be displaced near the end point devices, such as a laptop or tablet computer, personal computer, wearable computer, server, personal digital assistant (PDA), hybrid PDA/mobile phone, mobile phone, electronic book reader, set-top box, camera, digital media player, and the like. Upon a request for content from the user, the edge network device can request the remainder of the fragments of the content from the data center. The edge network device can receive the remainder of the fragments of the content and reconstruct the content to be transmitted to the end point device.

In some embodiments, the subset of the fragments of the content from erasure coding can be received from the edge network device and transmitted to the end point devices for early distribution. Upon request from the user for the content, the edge network device can request the remainder of the fragments of the content, transmit the remainder to the end point device, and the end point device can perform the reconstruction of the content. Sending a fractional amount of data and having the end point device reconstruct the content while streaming allows for less resource usage at the edge network devices to service more users rather than having to upgrade telecommunications and internet service provider infrastructure to improve baseline bandwidth capacity.

Transmitting Content to a User Device

Figure 2A:
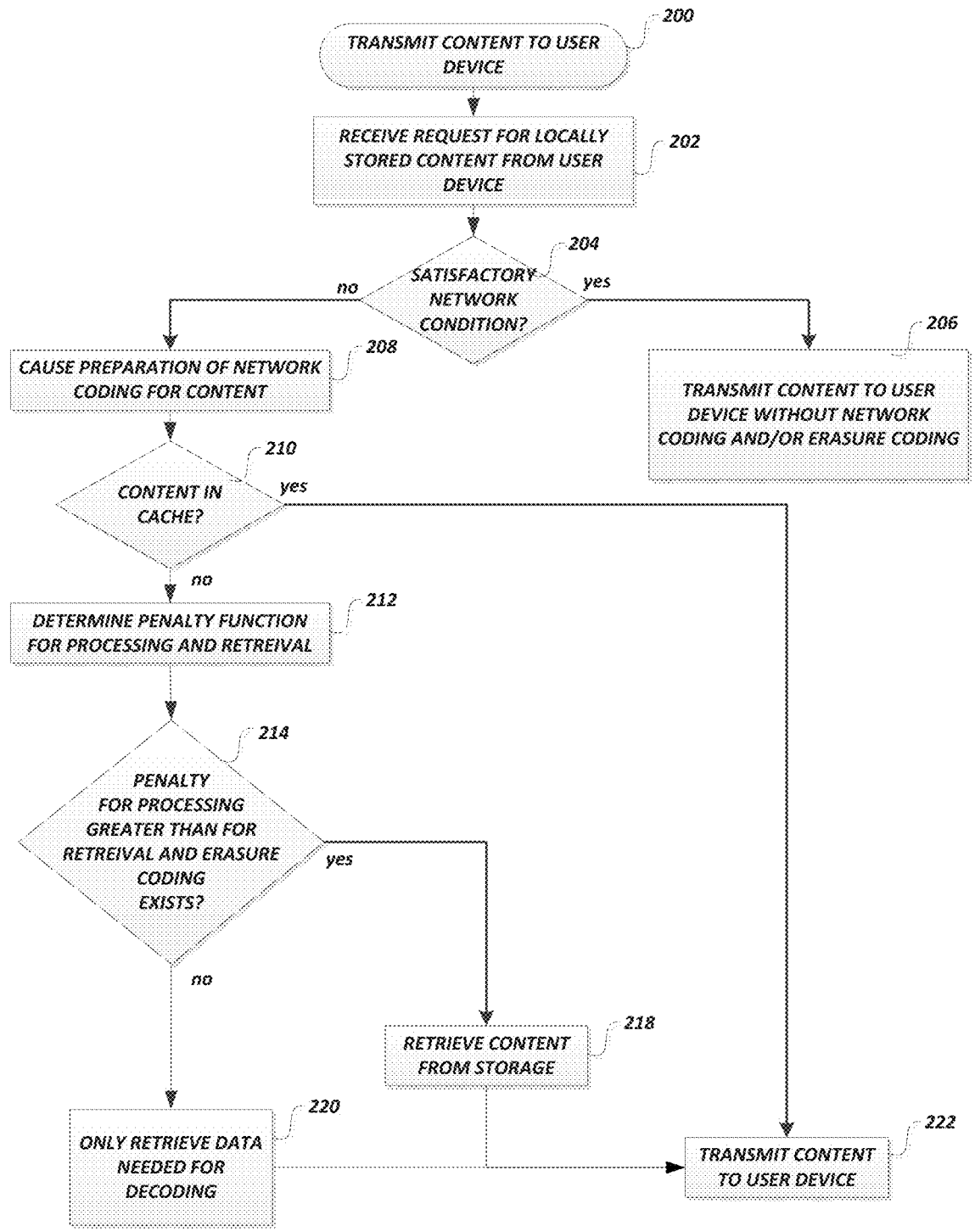
FIG. 2A is a flow chart illustrating the decision process for transmitting content to an end point, such as a user device according to some embodiments of the present disclosure.

FIG. 2A is a flow chart illustrating the decision process for transmitting content to an end point, such as a user device according to some embodiments of the present disclosure. In some embodiments, the edge network device determines a penalty function for content retrieval and a penalty function for content reconstruction using erasure coding, and determines whether to retrieve the content or request data sufficient to reconstruct the content.

Figure 4:
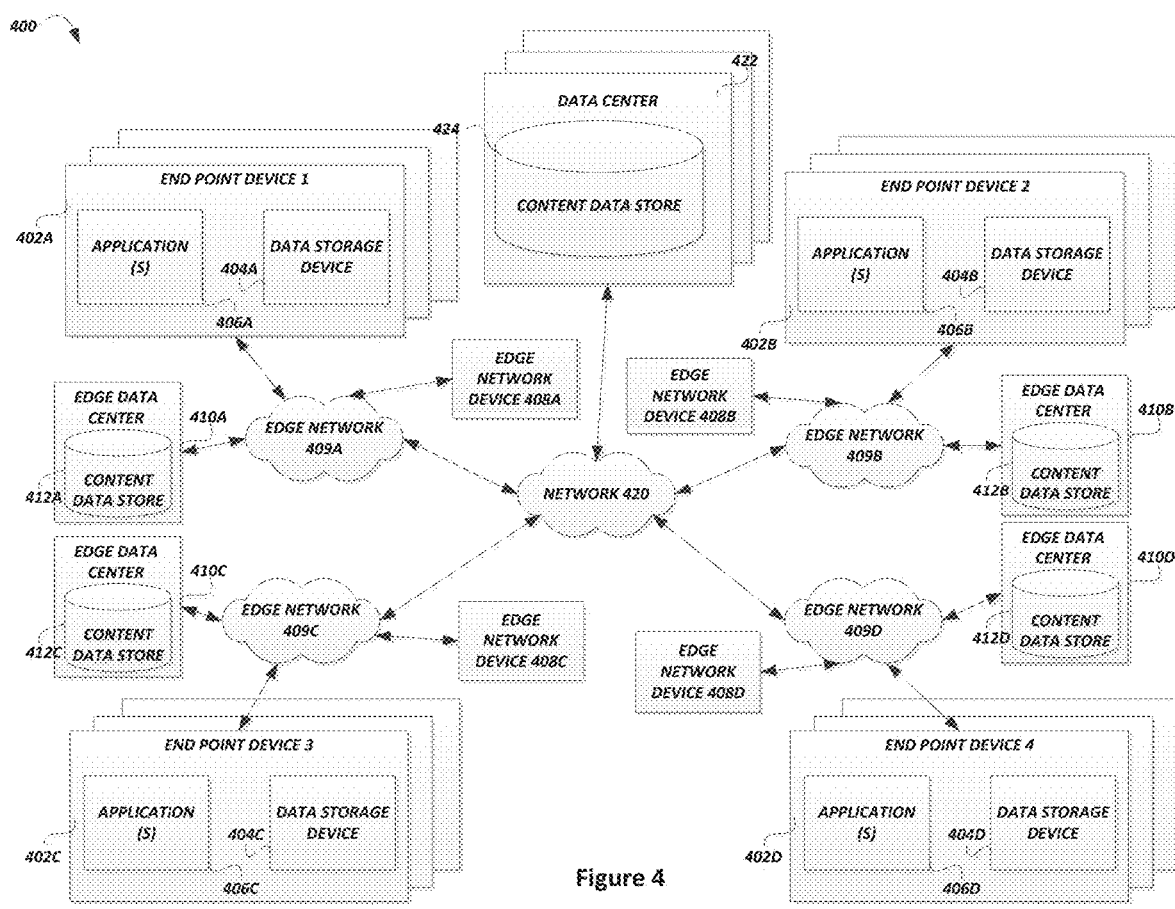
FIG. 4 is a block diagram illustrating a network infrastructure with edge network devices according to some embodiments of the present disclosure.

The illustrated process can be executed by one or more elements of the network illustrated in FIGS. 1, 4, or elsewhere in the specification. In certain embodiments, the illustrated process is implemented by an edge network device. The process may also be performed by a processor that is separate from the edge network device (such as, a data center, a software defined storage controller, a software defined network controller, and the like), by the edge network device or other device under directions from a separate processor, and the like.

The process starts at step 200. Next, in step 202, a request for content is received from the user device. In some embodiments, the request is for locally stored content at a particular location, such as a data center or the edge network device.

Next, in step 204, the network condition is assessed. The network condition can be based on bandwidth, throughput, time of the day, day of the week, day of the month, day of the year, data request demand in response to a certain event (such as, a sports event known to increase network traffic, an episode of a popular show), internal system capacity for network bandwidth, signal quality, latency, network equipment (such as, type of network equipment), channel of communication (such as, wireless, optical, Ethernet), required protocols for network packets, the number of requests and/or estimated requests for content, and the like. The network condition can comprise a network condition for one or more edge network devices. The network condition can comprise the network condition for one or more end point devices. The network condition can comprise the network condition for one or more data centers. The network condition can comprise the network condition for one or more controllers and/or switches. The network condition can comprise the network condition in relation with the network connecting among various nodes described in these examples.

Next, in step 206, if the network condition is determined to be satisfactory, the edge network device can transmit the content to the user device without network coding and/or without erasure coding. For example, the network condition can be determined to be satisfactory and/or not satisfactory based on a network condition threshold. The network condition threshold can be based on factors that affect network performance. For example, the network condition threshold can be based on network usage, network load, physical obstructions, network range, distance between devices, network interference, signal sharing, communication overhead, bandwidth usage, throughput usage, latency, jitter, error rate, and/or the like.

In step 208, if the network condition is determined not to be satisfactory, the edge network device can implement network coding for the content to be transmitted.

Next, in step 210, if the requested content is already stored locally (such as in cache storage), then at step 222, the content is sent to the user device. Advantageously, if the requested content is already stored in a cache storage, the content can be sent to the user device relatively quickly.

However, if the requested content is not stored locally, then in step 212, one or more penalty functions are identified and assessed. In some embodiments, the penalty function is associated with the penalty for retrieval (such as, the penalty function of the data storage device). In some embodiments, a penalty function is the penalty of processing the content (such as, the penalty function of the CPU). For example, the penalty function can include factors such as computational power, network activity, a multiple-tenancy environment, variability in segment quality, buffering time, and the like. An example of a penalty function can be:

$$f(q,e) = w_1 q(t) + w_2 e(t),$$

where $q(t)$ is the penalty of the quality of experience, $e(t)$ is the penalty for energy consumption to complete certain actions, $w_1$ and $w_2$ are weighting coefficients for the penalties, and $f(q,e)$ is the penalty function. In some embodiments, $q(t)$ and/or $e(t)$ are time-varying functions. In some embodiments, $q(t)$ and $e(t)$ are functions that contradict each other. For example, the quality of experience often requires the service to respond quickly, given a certain level of video quality on various network conditions. Thus, the shorter the response time, the smaller $q(t)$ can be. When the CPU or storage device has more free resources, the response time can be shorter.

Next, in step 214, if the penalty for processing the content is greater than retrieving the content and if erasure coding is available, then in step 218, the erasure coded content is retrieved directly from storage, such as a data center and sent to the user in step 222. Otherwise, in step 220, the edge network device can retrieve the remainder of the fragments of content needed to reconstruct the content at the edge network device. Next, in step 222, the edge network device sends the content to the user device.

In some embodiments, the endpoint device and/or network device may receive a request for content. The endpoint device and/or network device may be missing a fragment of the requested content either because the endpoint did not receive the fragment and/or the received fragment includes an error. The endpoint device and/or network device can either retrieve the fragment of the requested content from a remote data center and/or reconstruct the missing fragment from the fragments the endpoint already received and one or more parity fragments. The endpoint device and/or network device can make this determination based on a penalty function.

In some embodiments, the penalty function can include a determination of a latency to retrieve the fragment from the remote data center. For example, it may be faster to compute the fragment locally rather than retrieve the fragment from the remote data center because of high latency.

In some embodiments, the penalty function can include a demand at a device, such as a demand at a remote data center. If there is high demand for content from the remote data center, the endpoint device and/or network device may determine to reconstruct the fragment locally to improve the efficiency of the remote data center. Power and cooling requirements and/or budgets of the remote data center and/or other devices, such as the endpoint device and/or network device, can factor into the penalty function. Another factor can be network considerations, such as throughput. If the network is currently very busy, the endpoint device and/or network device can determine to reconstruct the fragment locally. Resource use and/or availability can also factor into the penalty function. For example, if the endpoint device and/or network device is currently running a lot of processes, then the endpoint device and/or network device may determine to retrieve the requested content from the remote data center.

In some embodiments, the penalty function can determine a time for encoding the requested content and/or to load the data directly from a disk. Based on the determined time(s), the endpoint device and/or network device can determine to retrieve the fragment of the requested content from a remote data center and/or reconstruct the missing fragment from the fragments the endpoint already received and one or more parity fragments.

Storing Requested Content

Figure 2B:
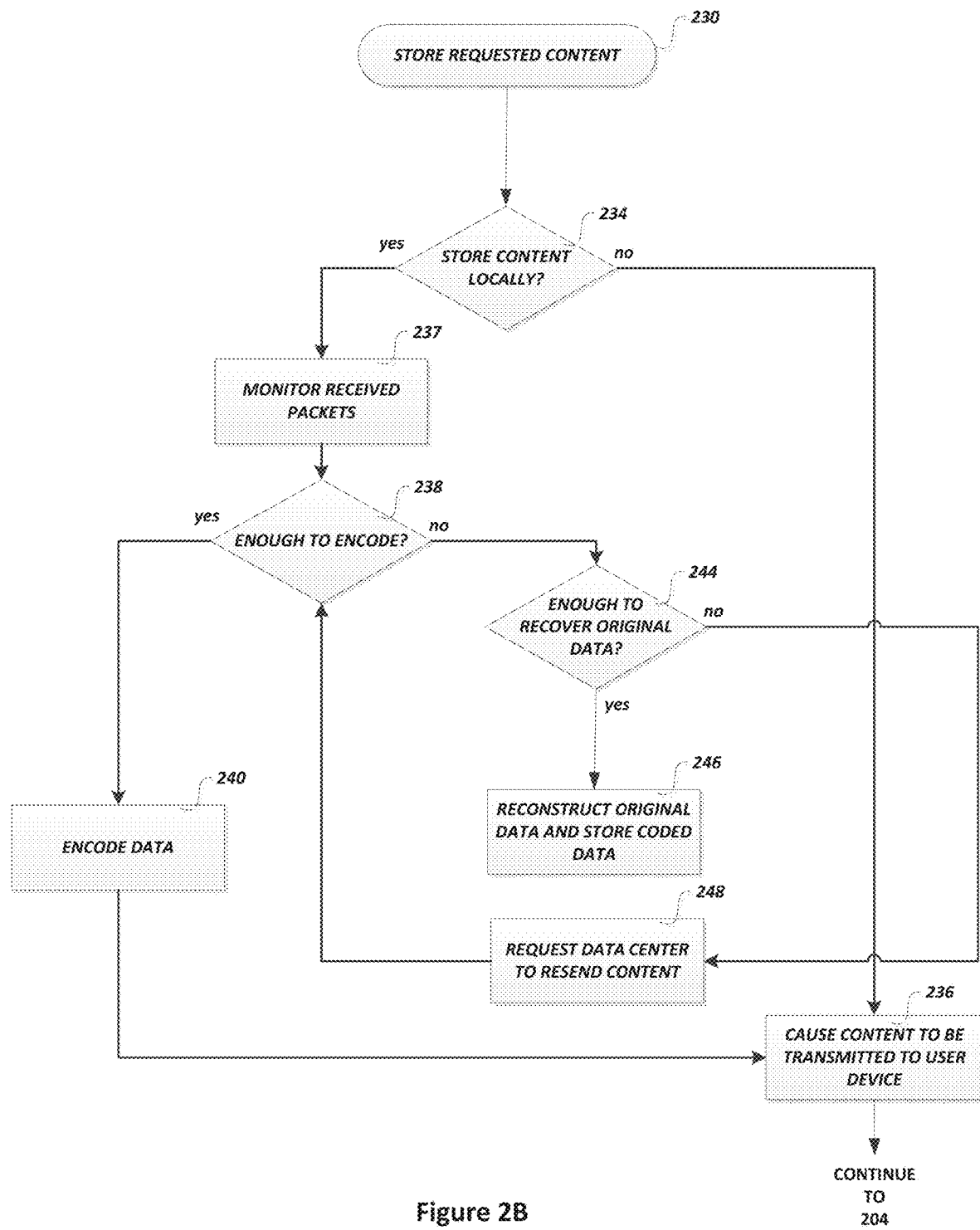
FIG. 2B is a flow chart illustrating the decision process for storing requested content on an edge network device according to some embodiments of the present disclosure.

FIG. 2B is a flow chart illustrating the decision process for storing requested content on an edge network device according to some embodiments of the present disclosure. In some embodiments, the edge network device determines whether the locally stored content is enough to implement erasure coding and/or sufficient to reconstruct the requested content.

The illustrated process can be executed by one or more elements of the network illustrated in FIGS. 1, 4, or elsewhere in the specification. In certain embodiments, the illustrated process is implemented by an edge network device. The process may also be performed by a processor that is separate from the edge network device (such as, a data center, a software defined storage controller, a software defined network controller, and the like), by the edge network device or other device under directions from a separate processor, and the like.

The process starts at step 230. At step 234, the edge network device determines whether the content is to be stored locally. If not, then at step 236, the edge network device causes the content to be transmitted to the user device, and the process continues to step 204.

If the edge network device determines that the content is to be stored locally, then in step 237, the edge network device monitors the received packets to determine if they received enough packets within a time window for erasure coding storage purposes. At step 238, the edge network device checks whether enough packets are received to build an erasure coding scheme with a predefined protection level and/or within a certain time window. If enough packets are determined to be received, then in step 240, the edge network device selects packets, generates coded data using erasure coding, and stores the coded data locally.

If the edge network device determines that not enough packets are received, then in step 244, the edge network device determines whether enough packets are received to recover the original data within a time window. If enough data packets are received, then in step 244, the edge network device reconstructs the erasure coding scheme based on the recovered data and stores the coded data in step 246. If enough data packets are not received, then at step 248, the edge network device requests the data center to resend the content. Then, the process continues to step 238.

Retrieving Content Requested by the User

Figure 2C:
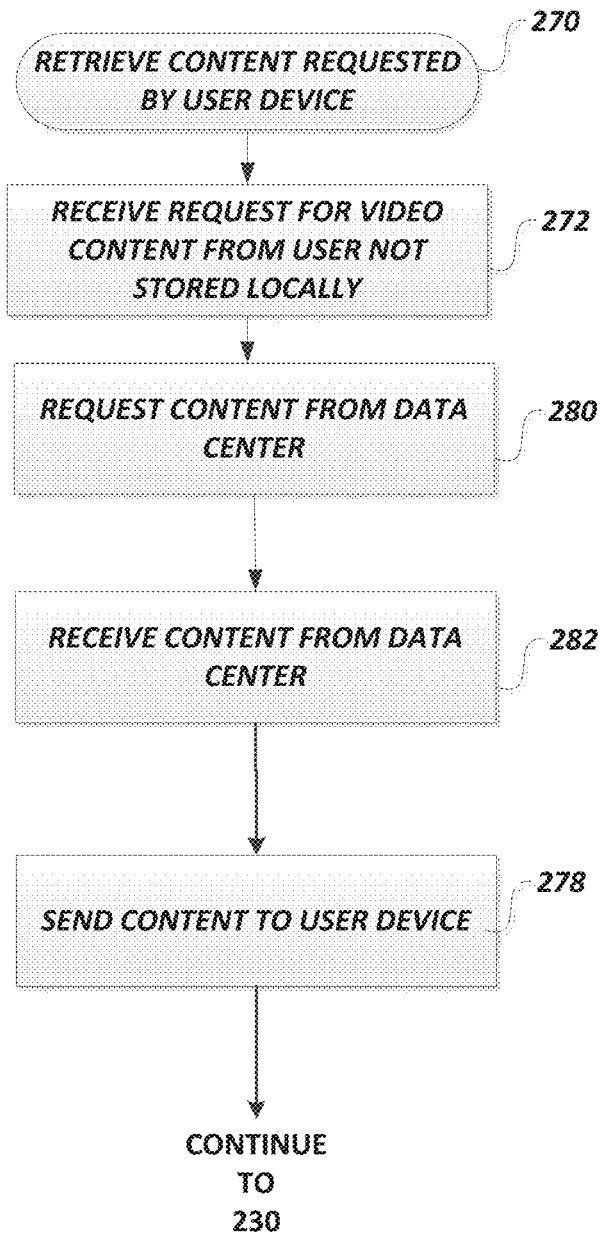
FIG. 2C is a flow chart illustrating the retrieval of content requested by the user according to some embodiments of the present disclosure.

FIG. 2C is a flow chart illustrating the retrieval content requested by the user according to some embodiments of the present disclosure. In some embodiments, the edge network device retrieves and sends content requested by the user device that is not stored locally.

The illustrated process can be executed by one or more elements of the network illustrated in FIGS. 1, 4, or elsewhere in the specification. In certain embodiments, the illustrated process is implemented by an edge network device. The process may also be performed by a processor that is separate from the edge network device (such as, a data center, a software defined storage controller, a software defined network controller, and the like), by the edge network device or other device under directions from a separate processor, and the like.

The process starts at step 270. Next, in step 272, a request for video content is received from the user device, content that is not stored locally. At step 280, the edge network device requests content from the data center, and in step 282, the edge network device receives the content. At step 278, the edge network device transmits the content to the user device.

Butterfly Network Coding

Figure 3A:
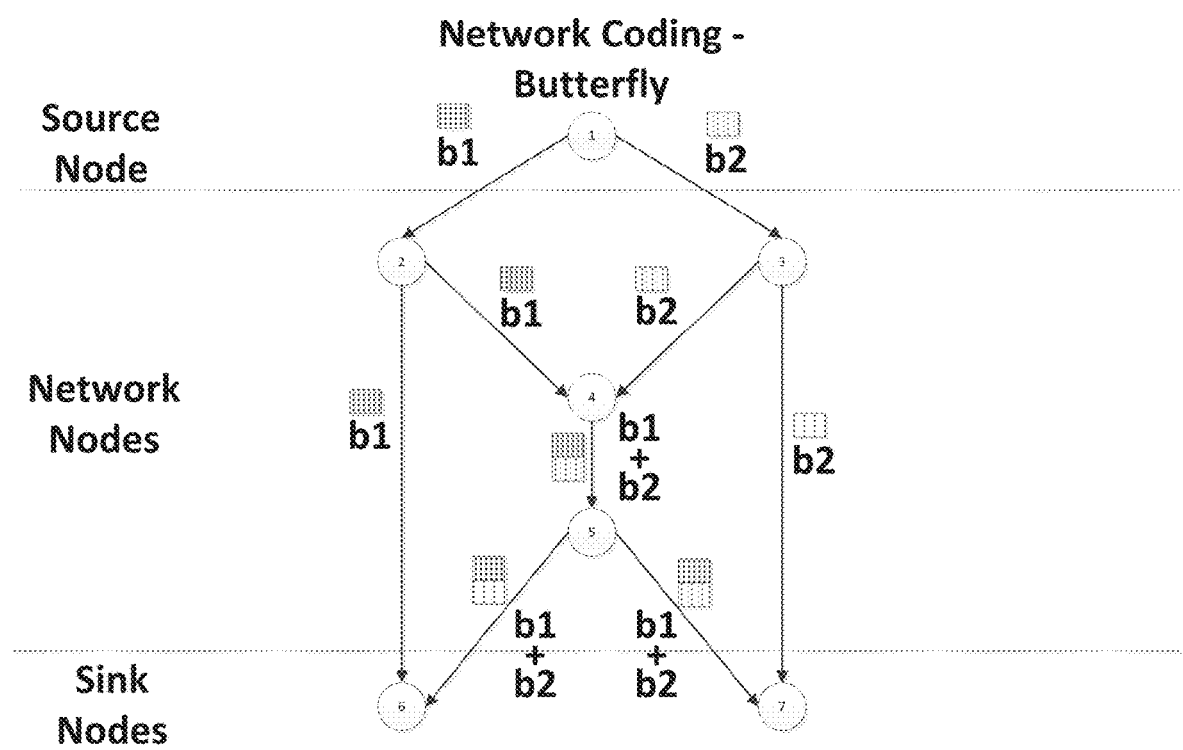
FIG. 3A is a diagram illustrating a butterfly network coding scheme according to some embodiments of the present disclosure.

FIG. 3A is a diagram illustrating a butterfly network coding scheme according to some embodiments of the present disclosure. In some embodiments, the edge network device and/or an SDS/SDN controller can implement a butterfly network coding scheme to transmit content to an end point device. The illustrated network coding scheme can be used with any of the embodiments of data transmission described herein.

In some embodiments, the butterfly network comprises one or more source nodes, one or more network nodes, and one or more sink nodes. In the example butterfly network of FIG. 3A, the butterfly network comprises one source node, four network nodes, and two sink nodes. Each link between the nodes can have a unit capacity. In this example, two packets, b1 and b2, are to be transmitted from the source node 1 to the sink nodes 6 and 7.

A butterfly network coding scheme can be used to send information over network links. Instead of simply relaying packets, network nodes can be used to combine incoming packets and send the resulting coded packets to outgoing edges. Network coding can lead to augmented throughput, reduce vulnerability, and provide ease of deployment in a large-scale distribution system. Network coding can also improve throughput, delay, resilience to packet loss, and system complexity.

One shortcoming of network coding can be that network coding may require processing in the middle of the network which can lead to additional delays, complexity, and vulnerability to byzantine attacks. However, erasure coding provides a viable solution to this shortcoming using in-network error control, such as Reed-Solomon codes, low density parity-check codes, turbo codes, LT codes, Raptor codes, and the like.

In this example, two packets, b1 and b2, and transmitted from the source node, node 1. The first packet, b1, is transmitted to network node 2, and the second packet, b2, is transmitted to network node 3.

The second network node transmits the first packet, b1, to both the network node 4 and the sink node 6. The third network node transmits the second packet, b2, to both the network node 4 and the sink node 7.

Intra-session network coding can be implemented on network nodes 4 and 5. Network node 4 combines the first and second packets, b1 and b2, and transmits the coded packet to network node 5. Network node 5 transmits the coded packet, b1 and b2, to both sink nodes 6 and 7. Sink node 6 received the first packet, b1, from the second network node, and can determine the second packet, b2, by subtracting the coded b1 and b2 packet from b1. As such, the two packets, b1 and b2, can be transmitted to both destinations, the sink nodes, simultaneously.

Modified Butterfly Network Coding

Figure 3B:
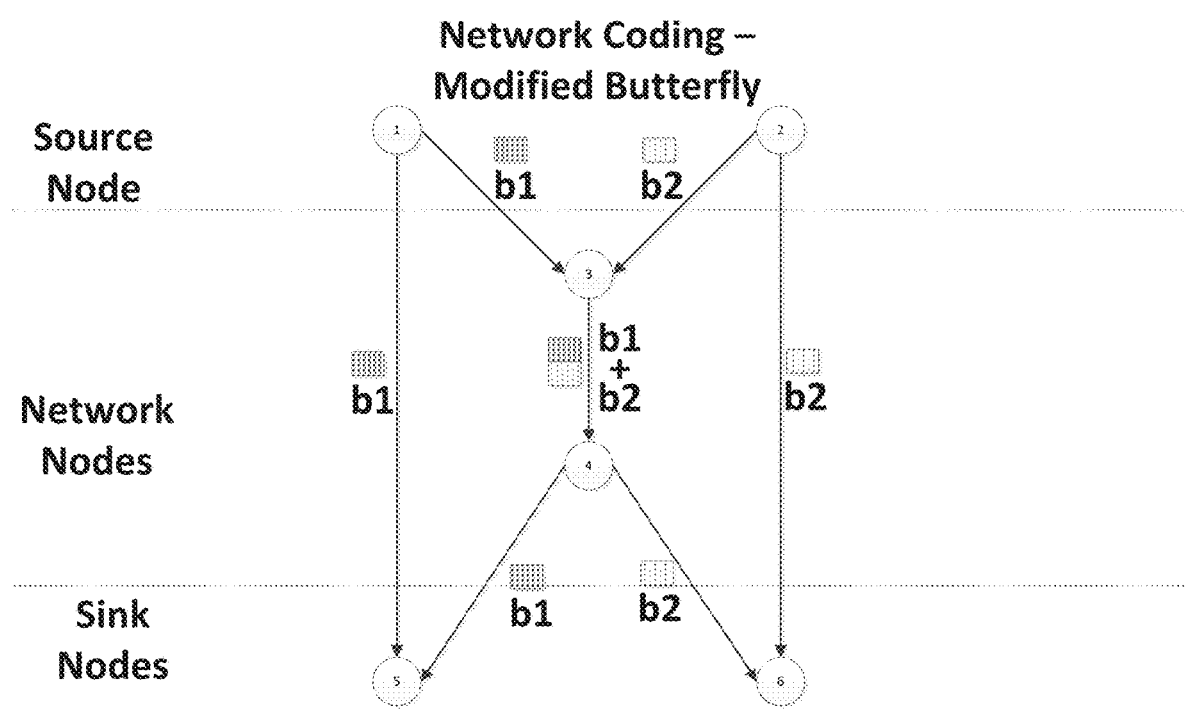
FIG. 3B is a diagram illustrating a modified butterfly network coding scheme according to some embodiments of the present disclosure.

FIG. 3B is a diagram illustrating a modified butterfly network coding scheme according to some embodiments of the present disclosure. In some embodiments, the edge network device and/or an SDS/SDN controller can implement a modified butterfly network coding scheme to transmit content to an end point device. The illustrated network coding scheme can be used with any of the embodiments of data transmission described herein.

In the example modified butterfly network of FIG. 3B, the modified butterfly network comprises two source nodes, two network nodes, and two sink nodes. In this example, a first packet, b1, is transmitted from the first source node, node 1. The first packet, b1, is transmitted to network node 3 and sink node 5. The second packet, b2, is transmitted from the second source node, node 2, to the network node 3 and the sink node 6. Intra-session network coding can be implemented on network nodes 3 and 4. Network node 3 combines the first and second packets, b1 and b2, and transmits the coded packet to network node 4. Network node 4 transmits the coded packet, b1 and b2, to both sink nodes 6 and 7.

For the network coding scheme of an in-network node, different network coding schemes can be selected. The selection can be based on network size. For example, for a small-to-medium network, deterministic network coding schemes can be used whereas for a large scale network, random schemes can be implemented for simple generation of policy. A pure random scheme for network coding can be selected when a fixed code for the storage side is desired (such as, when the coefficient matrix is fixed) and/or if an additional table on the storage side is used to record the random erasure coding scheme. In some embodiments, a group policy can be used, where the packets for the same chunk or file may use the same network coding matrix.

Erasure Coding

Figure 3C:
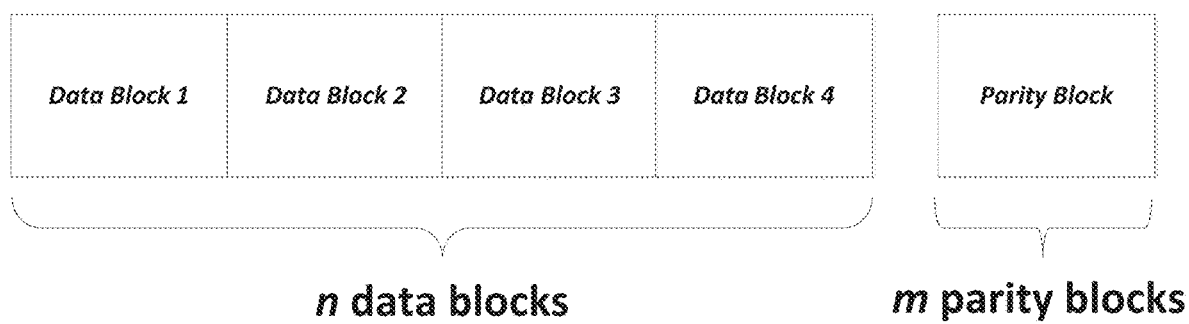
FIG. 3C is a diagram illustrating an erasure coding scheme according to some embodiments of the present disclosure.

FIG. 3C is a diagram illustrating an erasure coding scheme according to some embodiments of the present disclosure. In some embodiments, the edge network device and/or an SDS/SDN controller can implement an erasure coding scheme to fragment the content. Erasure coding scheme can be used with any of the embodiments of data transmission described herein. In some embodiments, for each erasure coding scheme configuration, each scheme can be divided into a total of n blocks with k as data blocks. Based on the level of desired protection, the number of data blocks can differ. For example, if a higher protection level is desired, then a higher n-k can be used.

In some embodiments, erasure coding can include a method of data protection in which data is broken into fragments, expanded and encoded with redundant data pieces, and stored across a set of different locations or storage media. In some embodiments, the content can be fragmented into one or more data blocks and/or one or more parity blocks. In the example of FIG. 3C, the content is fragmented into four data blocks and one parity block. Although FIG. 3C illustrates systematic erasure coding in which input data is embedded in the encoded output, systems and method disclosed herein can be used with non-systematic erasure coding in which the encoded output does not include the input data.

In some embodiments, a declustered RAID system is used. Unlike traditional RAID systems, a declustered RAID system can allow users to create arbitrarily sized storage arrays. For example, different capacity of data storage devices with different performances can be mixed in the same system. In traditional RAID systems, the data stripe and parity stripe groupings can include a fixed structure. Each data storage device in the traditional RAID system has equalized capacity. Thus, when one data storage device fails, the system needs to rebuild the entire data storage device, resulting in a long rebuild time. In a declustered RAID system, the data storage devices can be divided into small virtual data chunks. The virtual data chunks can be regrouped into a virtual data RAID array. The spare virtual data chunk can be scattered among the data group. Thus, if one drive fails, the rebuilding process not affect the other drives, reducing the rebuild time.

For the erasure coding scheme on the storage node, the erasure coding scheme can be applied to a read request and/or a write request. For the write request, if the packets with both data and parity are received within a time window, the packets can be stored directly. Otherwise, the edge network device can reconstruct the missing parity and/or data pieces. If the storage protection level is higher than the communication erasure level, then the product erasure coding scheme can be applied with more parities. For a read request, the edge network device can determine whether to the read and parity from the storage or only the data with the parity calculated. In some embodiments, this determination is based on a cost function, such as a cost function for the CPU, memory, data I/O, and the like.

Thus, a process based on a balancing on computation requirements and I/O operations can be implemented. For example, if the penalty for the CPU and storage indicates that the penalty for CPU cycles are higher than the penalty for reading the data from storage, the data can be reconstructed in real time by computers that do not have the data stored locally. Otherwise, the system can add more copies of the data such that the data is read in a single instruction, multiple data ("SIMD") manner.

Network Infrastructure with Edge Network Devices

FIG. 4 is a block diagram illustrating a network infrastructure with edge network devices according to some embodiments of the present disclosure. The illustrated network infrastructure can be similar to that illustrated in FIG. 1. The network infrastructure can include end point device 1 402A, end point device 2 402B, end point device 3 402C, and end point device 4 402D (collectively referred to herein as endpoint devices 402). The end point devices 402 can include an application 406A, 406B, 406C, 406D (collectively referred to herein as applications 406) and/or a data storage device 404A, 404B, 404C, and 404D (collectively referred to herein as data storage devices 404). The network infrastructure can comprise edge network devices 408A, 408B, 408C, 408D (collectively referred to herein as edge network devices 408), edge networks 409A, 409B, 409C, 409D (collectively referred to herein as edge networks 409), an edge data center 410A, 410B, 410C, and 410D (collectively referred to herein as edge data centers 410), a data center 422, and core network 420 connecting the edge networks 409 and the data center 422. The edge data centers 410 can include a content data store 412A, 412B, 412C, 412D (collectively referred to herein as content data stores 412). The data center 422 can include a content data store 424.

In some embodiments, the edge network device 408 can be connected to the edge network 409 and/or can receive a request for content from the end point device 402. The edge network device 408 can search for the content locally in the edge data center 412 within the content data store 412. If the content is located locally, then the edge network device 408 can check the network condition to determine how the edge network device 408 will send the content to the end point device 402. If the content is not located locally, then the edge network device 408 can request the video content from the data center 422.

If the network condition is sufficient and/or satisfactory, the edge network device 408 can send the content directly to the end point device 402 without implementing network coding or identify pieces to reconstruct the data. If the network condition is not sufficient and/or not satisfactory, the edge network device 408 can implement network coding to send the content to the user. The network condition can be determined to be satisfactory based on a network condition threshold. For example, the network condition threshold can be based on factors that affect network performance, such as network usage, network load, physical obstructions, network range, distance between devices, network interference, signal sharing, communication overhead, bandwidth usage, throughput usage, latency, jitter, error rate, and/or the like. In some embodiments, the network condition is determined to be satisfactory if one or more scores for the transmission requirements meet one or more scores for the network condition.

The edge network device 408 can check whether the requested packets exist in a cache or buffer. If the packets are in a cache or buffer of the edge network device 408, the edge network devices can send the packets to the user. If the packets are not in the cache or buffer, the edge network device can check penalty functions for computational processing and content retrieval from the data storage device. If the penalty for computation or processing is less than the penalty for retrieving the content from the data storage device and if data is encoded, for example using erasure coding, then the edge network devices 408 can read the video data only to recover the remainder of encoded fragments to reconstruct the information, and then send the content to the end points device 402. Otherwise, the edge network device 408 can read the entire encoded content from the data storage device and send the packet to the end point device 402.

In some implementations, the penalty determinations can be based on certain characteristics of the content, network, demand, telecommunications infrastructure, user device, and the like. For example, the one or more penalty determinations can assess the penalty for accessing storage, computational power, user demand at certain time periods, protection level desired for sensitive content, and/or network bandwidth for optimal resource usage in order to provide data to user in the most efficient manner. For instance, if the penalty for processing is less than the penalty for retrieving the content from the data storage device, the edge network devices 408 can read the remaining fragments and reconstruct the information instead of reading the entire content from the data storage device, utilizing the already received fragments. For example, the edge network devices 408 can retrieve minimal amount of data from storage and utilize one or more coding approaches described herein, such as erasure coding, to compute encoded data for transmitted to the end point device 402. On the other hand, if the penalty for processing is greater than the penalty for retrieving the content from the data storage device, the edge network devices 408 can retrieve the full requested content from storage and transmit the full requested content to the end point device 402. In some embodiments, if the full requested content is retrieved from storage and transmitted to the endpoint device 402, the requested content can be sent with or without encoding the requested content.

In some embodiments, by assessing the penalties, the edge network devices 408 can better optimize their use of resources, including computational power and accessing storage. Furthermore, such designs can free the network from having to send the entire content over the network, which can be helpful during peak network traffic times when network bandwidth and/or throughput is close to capacity. Also, if the transmission lines are lossy based on an error rate and/or jitter, the edge network devices 408 can instead decide to recover only the remainder of the fragments instead of all of the fragments for the content.

If the content is not stored locally on the edge network device 408 in the edge data center 410, the edge network device 408 requests the content from the data center 422. The data center 422 can send out the network coding packets to the edge network devices 408.

The edge network device can receive the contents from the data center 422 and check if the content is to be stored locally at the edge data center 410. If the data is to be stored locally, the edge network devices 408 can check if enough packets are received to build an erasure coding scheme within a predefined protection level and within a certain time window. Otherwise, the edge network device can send the packets to the user.

If enough packets were received by the edge network device 408, the edge network device 408 can code the data using erasure coding, store the coded data, and send the intended packets to the end point device 402. If the edge network device 408 did not receive enough packets, the edge network device 408 can check if enough packets are received to recover the original data within the time window. If enough packets are received, then the edge network device 408 can reconstruct the erasure coding scheme based on the recovered data, store the coded data, and send the content to the end point device 402. Otherwise, the edge network device 408 can request the data center 422 to resend the packets. Then the edge network device 408c can check if enough packets are received to build the erasure coding scheme again.

The edge network devices 408 can receive data from the data center 422. The integrated erasure coding scheme can be suitable for this type of infrastructure with inter-network edge devices 408 with both storage and computing functionalities. In some embodiments, the edge network devices 408 include microservers with storage and bandwidth resources that can download and/or store videos to respond to user requests for the videos.

In some embodiments, the infrastructure can be a part of video streaming service providers, internet service providers, and/or third parties such as nodes in large communities. In some embodiments, the edge network devices 408 can be used in an assisted Peer-to-peer structure and/or in an Openstack/Ceph structure with metadata services.

Integration of Software Defined Storage and Software Defined Network

Figure 5:
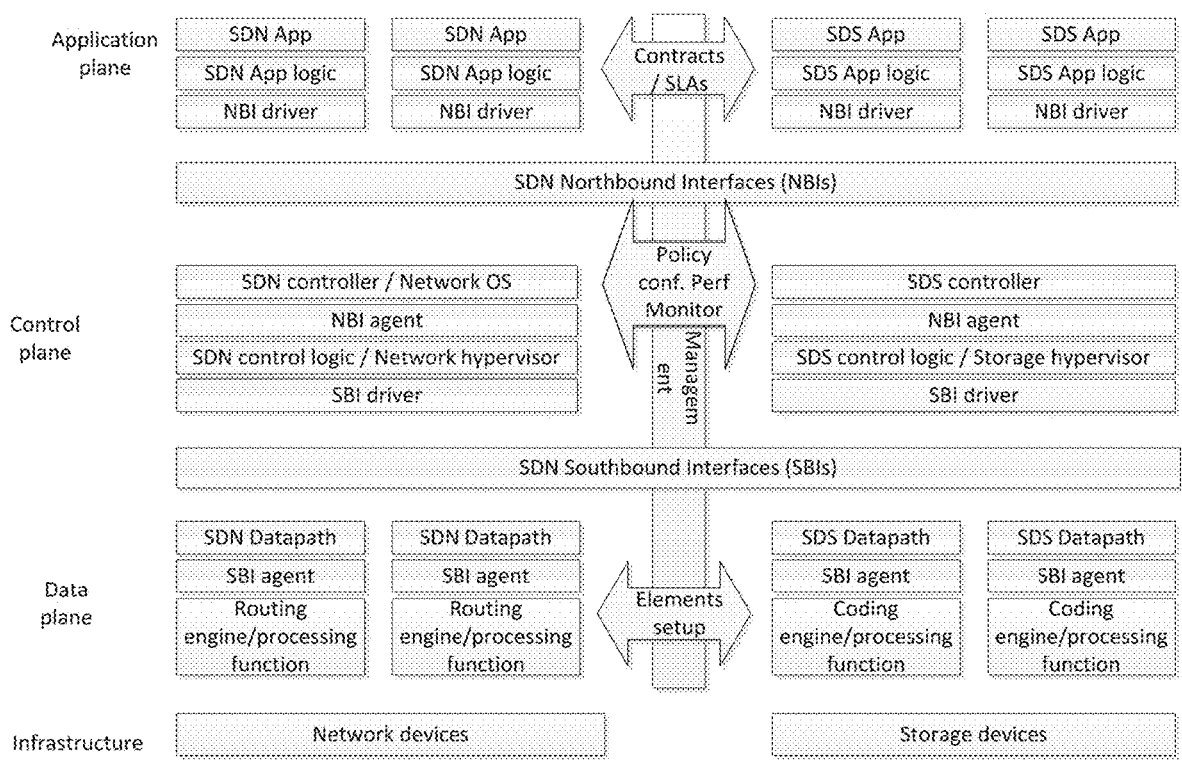
FIG. 5 is a block diagram illustrating the integration of the software defined storage and the software defined network according to some embodiments of the present disclosure.

FIG. 5 is a block diagram illustrating the integration of the software defined storage and the software defined network according to some embodiments of the present disclosure. The illustrated architecture can be implemented by the network illustrated in FIGS. 1, 4, or elsewhere in the specification.

As is illustrated, on the SDN side (left portion of the figure), at bottom, the data plane can include network devices, whose SDN datapaths expose their capabilities through a control plane. On top, SDN applications can be included in the application plane, and can communicate their requirements via northbound interface (NBI) drivers. In the middle, the control plane can translate these requirements and exert low-level control over the SDN datapaths, while providing relevant information up to the SDN applications. The control plane can control storage management, policy automation, analytics, optimization, replication, erasure coding, snapshot policy management, data backup, recovery service, and the like.

As illustrated, the management plane can handle communication between SDN services and SDS services. On the SDS side (right portion of the figure), at bottom, the data plane can include network devices, whose SDS datapaths expose their capabilities through the control plane. On top, SDS applications can be included in the application plane, and can communicate their requirements via northbound interface (NBI) drivers. In the middle, the control plane can translate these requirements and exert low-level control over the SDS datapaths, while providing relevant information up to the SDS applications.

In some embodiments, the SDN applications communicate contracts and service level agreements (SLAs) with the SDS applications via the management plane. An SDN application can include SDN application logic and an NBI driver. An SDS application can include SDS application logic and an NBI driver.

In some embodiments, the control plane can include one or more SDN controllers configured to translate requirements from the SDN application layer to SDN datapaths and/or provide the SDN application with an abstract view of the network. An SDN controller can include an NBI agent, SDN control logic and/or network hypervisor, and/or an southbound interface (SBI) driver. An SDN controller and/or network operating system can communicate policy confirmation and performance monitoring with a software defined storage controller. This can be performed via the management plane. An SDS controller and/or network operating system can include an NBI agent, a software defined network control logic and/or network hypervisor, and/an SBI driver.

In some embodiments, an SDN datapath can communicate elements setup with the SDS datapath. This can be performed via the management plane. An SDN datapath can include an SBI agent and a routing engine/processing function. The SDS datapath can include an SBI agent and a coding engine/processing function.

Random Network Coding

In some embodiments, the edge network device can implement a random network coding with a small field size of the Galois Field. Typically, random network coding can achieve small field size, q, to make linear independency, and thus, the word size for network coding can be smaller.

In some embodiments, the edge network device can implement a random linear network coding ("RLNC"), which can broadcast transmission schemes allowing optimal throughput using a decentralized process. Nodes can transmit random linear combinations of the packets they receive with coefficients chosen from a Galois Field. Furthermore, if a receiver obtains an insufficient number of packets such that the receiver cannot recover the original packets, additional random linear combinations can be transmitted until the receiver obtains the appropriate number of packets. The field size, q, can be of a variety of different sizes (such as, 2, 256, or the like). The random linear network coding scheme can provide high decoding computational complexity due to the use of the Gauss-Jordan elimination method, can provide high transmission overhead due to the large coefficient vectors to encode the blocks, and linear dependency among coefficient vectors which can reduce the number of encoded blocks.

Other Variations

Those skilled in the art will appreciate that in some embodiments additional system components can be utilized, and disclosed system components can be combined or omitted. Although some embodiments describe video data transmission, disclosed systems and methods can be used for transmission of any type of data. In addition, although some embodiments utilize erasure coding, any suitable error correction schemes can be used. The actual steps taken in the disclosed processes, such as the processes illustrated in FIGS. 2A-2C, may differ from those shown in the figures. Depending on the embodiment, certain of the steps described above may be removed, others may be added. Accordingly, the scope of the present disclosure is intended to be defined only by reference to the appended claims.

Any one or more embodiments described herein can be used in combination with any one or more embodiments described in a co-pending patent Application No. 5/847,734, filed on Dec. 19, 2017, "HYBRID TECHNIQUES FOR CONTENT DISTRIBUTION WITH EDGE DEVICES" the disclosure of which is hereby incorporated by reference in its entirety. While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (such as, DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, references to "a method" or "an embodiment" throughout are not intended to mean the same method or same embodiment, unless the context clearly indicates otherwise.

The corresponding structures, materials, acts, and equivalents of all means or step plus function elements in the claims below are intended to include any structure, material, or act for performing the function in combination with other claimed elements as specifically claimed. The description of the various embodiments of the present disclosure has been presented for purposes of illustration and description, but is not intended to be exhaustive or limited to the embodiments disclosed. Many modifications and variations will be apparent to those of ordinary skill in the art without departing from the scope and spirit of this disclosure. The example embodiments were chosen and described in order to best explain the principles of this disclosure and the practical application, and to enable others of ordinary skill in the art to understand this disclosure for various embodiments with various modifications as are suited to the particular use contemplated.

Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A network device, comprising:
a memory comprising a cache and permanent storage; and
one or more processors configured to receive a request for information from a user device, the one or more processors further configured to:
in response to determining that an erasure encoded version of the requested information is stored in the memory of the network device:
in response to determining that a network condition does not satisfy a transmission quality threshold:
in response to determining that the erasure encoded version of the requested information is not stored in the cache of the network device:
in response to determining that a penalty for erasure encoding the requested information exceeds a penalty for retrieving the erasure encoded version of the requested information from the permanent storage of the network device, retrieve from the permanent storage and transmit the erasure encoded version of the requested information to the user device by applying network coding; and
in response to determining that the penalty for erasure encoding the requested information does not exceed the penalty for retrieving the erasure encoded version of the requested information from the permanent storage of the network device, partially retrieve the requested information from the permanent storage, erasure encode the partially retrieved requested information, and transmit the produced erasure encoded version of the requested information to the user device by applying network coding, wherein the partially retrieved requested information is a subset of the requested information needed to reconstruct the requested information at the network device.

2. The network device of claim 1, wherein the one or more processors are further configured to:
in response to determining that the network condition satisfies a transmission quality threshold, transmit the erasure encoded version of the requested information to the user device without applying network coding.

3. The network device of claim 1, wherein the one or more processors are further configured to:
in response to determining that the erasure encoded version of the requested information is stored in the cache of the network device, transmit the erasure encoded version of the requested information to the user device.

4. The network device of claim 1, wherein the one or more processors are further configured to:
in response to determining that the erasure encoded version of the requested information is not stored in the memory of the network device:
request that the requested information be transmitted from a data center and receive the requested information from the data center;
determine if the received requested information can be stored in the memory of the network device; and
in response to determining that the received requested information cannot be stored in the memory, transmit the received requested information based on the network condition.

5. The network device of claim 4, wherein transmission of the received requested information based on the network condition comprises transmitting the received requested information via network coding using a butterfly network with at least one multicast session.

6. The network device of claim 4, wherein transmission of the received requested information based on the network condition comprises selecting a type of network coding based on the network condition, wherein the type of network coding includes at least one of: a deterministic network coding scheme or a random network coding scheme.

7. The network device of claim 4, wherein the one or more processors are further configured to:
in response to determining that the received requested information can be stored in the memory of the network device:
in response to determining that an amount of the received requested information satisfies an erasure encoding threshold, erasure encode the received requested information, store the erasure encoded received requested information in the permanent storage of the network device, and transmit the erasure encoded received requested information based on the network condition.

8. The network device of claim 7, wherein the one or more processors are further configured to:
in response to determining that the amount of the received requested information does not satisfy the erasure encoding threshold:
in response to determining that the erasure encoding threshold can be satisfied within a time duration, erasure encode the received requested information, store the erasure encoded received requested information in the permanent storage of the network device, and transmit the erasure encoded received requested information based on the network condition; and
in response to determining that the erasure encoding threshold cannot be satisfied within the time duration, request that the received requested information be transmitted from the data center.

9. A system comprising the network device of claim 1.

10. A method of transmitting data comprising:
in response to determining that an erasure encoded version of the requested information is stored in a storage external to a network device:
in response to determining that a network condition does not satisfy a transmission quality threshold:
in response to determining that an erasure encoded version of requested information is not stored in a cache of the network device:
in response to determining that a penalty for erasure encoding the requested information exceeds a penalty for retrieving the erasure encoded version of the requested information from the storage external to the network device, retrieving from the storage external to the network device and transmitting the erasure encoded version of the requested information by applying network coding; and
in response to determining that the penalty for erasure encoding the requested information does not exceed the penalty for retrieving the erasure encoded version of the requested information from the storage external to the network device, partially retrieving the requested information from the storage external to the network device, erasure encoding the partially retrieved requested information, and transmitting the produced erasure encoded version of the requested information by applying network coding, wherein the partially retrieved requested information is a subset of the requested information needed to reconstruct the requested information at the network device.

11. The method of claim 10, wherein determining that the penalty for erasure encoding the requested information exceeds the penalty for retrieving the erasure encoded version of the requested information from the storage external to the network device is based on at least one of:
a processing consumption, a response time, a segment quality, a storage capability, a power consumption, or a buffering time.

12. The method of claim 10, wherein the penalty for erasure encoding the requested information is based on processing consumption, and the penalty for retrieving the erasure encoded requested information from the storage external of the network device is based on storage capability.

13. The method of claim 10, wherein the requested information comprises video content.

14. The method of claim 10, wherein transmitting the produced erasure encoded version of the requested information comprises selecting a type of network coding based on a network condition, wherein the type of network coding includes a hybrid network coding scheme.

15. A network device, comprising:
a memory comprising a cache and permanent storage; and
one or more processors configured to receive a request for information from a user device, the one or more processors further configured to:
in response to determining that an erasure encoded version of the requested information is stored in the memory of the network device:
in response to determining that a penalty for erasure encoding the requested information exceeds a penalty for retrieving the erasure encoded version of the requested information from the permanent storage of the network device, retrieve from the permanent storage and transmit the erasure encoded version of the requested information to the user device by applying network coding; and
in response to determining that the penalty for erasure encoding the requested information does not exceed the penalty for retrieving the erasure encoded version of the requested information from the permanent storage of the network device:
partially retrieve the requested information from the permanent storage,
erasure encode the partially retrieved requested information, and
transmit the produced erasure encoded version of the requested information to the user device by applying network coding, wherein the partially retrieved requested information is a subset of the requested information needed to reconstruct the requested information at the network device.

16. The network device of claim 15, wherein the one or more processors are further configured to:
in response to determining that the erasure encoded version of the requested information is not stored in the memory of the network device:
request that the requested information be transmitted from a storage external to the network device and receive the requested information from the storage external to the network device;
in response to determining that an amount of the received requested information satisfies an erasure encoding threshold, erasure encode the received requested information, and store the erasure encoded received requested information in the permanent storage of the network device; and
in response to determining that the amount of the received requested information does not satisfy the erasure encoding threshold:
in response to determining that the erasure encoding threshold can be satisfied within a time duration, erasure encode the received requested information, and store the erasure encoded received requested information in the permanent storage of the network device; and
in response to determining that the erasure encoding threshold cannot be satisfied within the time duration, request that the received requested information be retransmitted from the storage external to the network device.

17. The network device of claim 15, wherein the requested information comprises video content.

18. The network device of claim 15, wherein the penalty for erasure encoding the requested information is based on processing consumption, and the penalty for retrieving the erasure encoded requested information from the permanent storage of the network device is based on storage capability.

19. The network device of claim 15, wherein to transmit the produced erasure encoded version of the requested information comprises transmitting the requested information via network coding using a butterfly network with at least one multicast session.

* * * * *